United States Patent
Doll et al.

(10) Patent No.: US 6,764,219 B2
(45) Date of Patent: Jul. 20, 2004

(54) FULL COMPLEMENT ANTIFRICTION BEARING

(75) Inventors: Gary L. Doll, Canton, OH (US); Gerald P. Fox, Massillon, OH (US)

(73) Assignee: The Timken Company, Canton, OH (US)

( * ) Notice: Subject to any disclaimer, the term of this patent is extended or adjusted under 35 U.S.C. 154(b) by 36 days.

(21) Appl. No.: 10/114,832

(22) Filed: Apr. 2, 2002

(65) Prior Publication Data
US 2003/0185478 A1 Oct. 2, 2003

(51) Int. Cl.[7] ............................................. F16C 19/36
(52) U.S. Cl. ...................... 384/565; 384/492; 384/571
(58) Field of Search ................... 384/492, 565, 384/571, 569, 625

(56) References Cited

U.S. PATENT DOCUMENTS

| 4,293,171 | A | 10/1981 | Kakumoto et al. | |
| 4,522,453 | A | 6/1985 | Lammer et al. | |
| 5,067,826 | A | 11/1991 | Lemelson | 384/402 |
| 5,165,804 | A | 11/1992 | Fisher et al. | 384/492 |
| 5,228,786 | A | 7/1993 | Tanimoto et al. | |
| 5,593,234 | A | 1/1997 | Liston | 384/492 |
| 5,700,094 | A | 12/1997 | Dam et al. | 384/569 |
| 5,967,670 | A | 10/1999 | Gabelli et al. | 384/492 |
| 6,149,311 | A | 11/2000 | Gabelli et al. | 384/492 |
| 6,234,679 | B1 | 5/2001 | Siostrom | 384/565 |
| 6,318,898 | B1 | 11/2001 | Ward et al. | |
| 6,340,245 | B1 | 1/2002 | Horton et al. | 384/492 |
| 6,357,923 | B1 | 3/2002 | Sato et al. | |

FOREIGN PATENT DOCUMENTS

| EP | 0794345 A2 | 10/1997 |
| JP | 58113629 | 7/1983 |
| JP | 06006949 | 1/1994 |
| JP | 06193637 | 7/1994 |
| JP | 09177774 | 7/1997 |
| WO | 0133091 A1 | 5/2001 |

OTHER PUBLICATIONS

T. Lunow, R.Kocis, G. Leonhardt, and R. Wilberg, Surface & Coatings Technology 76–77, 579 (1995).
The Guide to More Reliable Precision Components, (The Balzers Company, Balzers, Liechtenstein, 1996) p. 24–25.
The Tapered Roller Bearing Guide (The Timken Company, Canton, Ohio 1994), p. 107.

*Primary Examiner*—Lenard A. Footland
(74) *Attorney, Agent, or Firm*—Polster, Lieder, Woodruff & Lucchesi L.C.

(57) ABSTRACT

A full complement antifriction bearing includes an inner race, an outer race, and rolling elements organized in a circular row between the races without a cage or retainer for separating the rolling elements. While the absence of a cage or retainers enable the bearing to have the maximum number of rolling elements and thus transfer greater loads, adjacent rolling elements contact each other. Each rolling element or every other rolling element is covered with a tribological coating that retards adhesive wear and reduces friction.

24 Claims, 1 Drawing Sheet

FULL COMPLEMENT ANTIFRICTION BEARING

CROSS REFERENCE TO RELATED APPLICATIONS

None

STATEMENT REGARDING FEDERALLY SPONSORED RESEARCH OR DEVELOPMENT

Not Applicable.

BACKGROUND OF THE INVENTION

This invention relates in general to antifriction bearings and more particularly to full complement antifriction bearings.

Antifriction bearings, often referred to as rolling element bearings, find widespread use in a variety of machinery generally to support one machine component on another such that the one can rotate relative to the other. The typical antifriction bearing includes an inner race or ring provided with a raceway that is presented outwardly away from the axis of the bearing, an outer ring or race provided with a raceway that is presented inwardly toward the axis and toward the raceway on the inner race, and rolling elements arranged in a circular row between the raceways of the two races. The rolling elements may take the form of balls, tapered rollers, cylindrical rollers, spherical rollers or even so-called "needles". Most antifriction bearings also include a retainer or cage to maintain a uniform separation between the rollers and with some types of bearings to further keep the rolling elements oriented properly between the raceways. Most cages contain pockets, although in some bearings containing rollers, the cages may have pins that project into the rollers where they serve as a spindle about which the rollers rotate. A pocket-type cage, which is usually formed from pressed steel, must of necessity spread the rolling elements apart to fit between them, and this reduces the load-carrying capacity of the bearing. The pin-type cages, since the pins do not pass between the rollers but instead project through them, enable the rollers to be organized with less spacing between them, so a bearing equipped with such a cage will have greater capacity than one equipped with a pocket-type cage. However, pin-type cages are not as durable as pocket-type cages, and furthermore cannot be used with some types of rolling elements.

Full complement antifriction bearings have no cages whatsoever and thus can hold the maximum number of rolling elements—a full complement, in other words. Without a cage to separate the rolling elements, adjacent rolling elements in a full complement bearing can and actually do contact each other during the operation of the bearing and also while the bearing is at rest. Indeed, when the bearing is not in operation, the contact between adjacent rolling elements can produce an adhesive wear condition known as fretting. Basically, fretting occurs when the asperities along contacting surfaces of adjacent rolling elements cold weld together. Microscopic motion between the contacting surfaces, which motion may be generated by vibrations, causes the welds to break, and this, if repeated over time, results in a deterioration of the surfaces.

Adhesive wear can also occur along contacting surfaces of adjacent rolling elements when the bearing is in operation. Normally, a hydrodynamic lubrication film exists between the rolling elements and the raceway along which they roll, and thus inhibits adhesive wear between these contacting surfaces. The same does not hold true with regard to contacting rolling elements at the point or line of contact between adjacent rolling elements. According to Dowson's equations, the thickness of the lubricant film along contacting surfaces in a rolling element bearing is:

$$h = K_D \left\{ \frac{a^{0.54} R^{0.43} (\mu_0 V)^{0.7}}{W^{0.13}} \right\}$$

where $K_D$ is a constant containing the modulus of elasticity, $\mu_0$ is the lubricant viscosity, V is the entrainment velocity, $\alpha$ is the lubricant pressure viscosity coefficient, W is the load per unit length, and R is an equivalent radius. Since at the contact point or line between the rolling elements in a full complement bearing the tangential velocities for each element are of equal magnitude but opposite direction, the entrainment velocity at that contact is zero, and the thickness h of the hydrodynamic lubrication is likewise zero. This exposes the rolling elements to adhesive wear.

Of course, frictional or abrasive wear also occurs where adjacent rolling elements contact each other with the bearing in operation.

BRIEF SUMMARY OF THE INVENTION

The present invention resides in an antifriction bearing including first and second races provided with raceways and rolling elements located between the races and contacting the raceways along the raceways. The rolling elements are arranged such that adjacent rolling elements contact each other, and at least some of the rolling elements are covered with a tribological coating.

BRIEF DESCRIPTION OF THE SEVERAL VIEWS OF THE DRAWINGS

Corresponding reference characters indicate corresponding parts throughout the several views of the drawings.

DETAILED DESCRIPTION OF INVENTION

Figure 1:
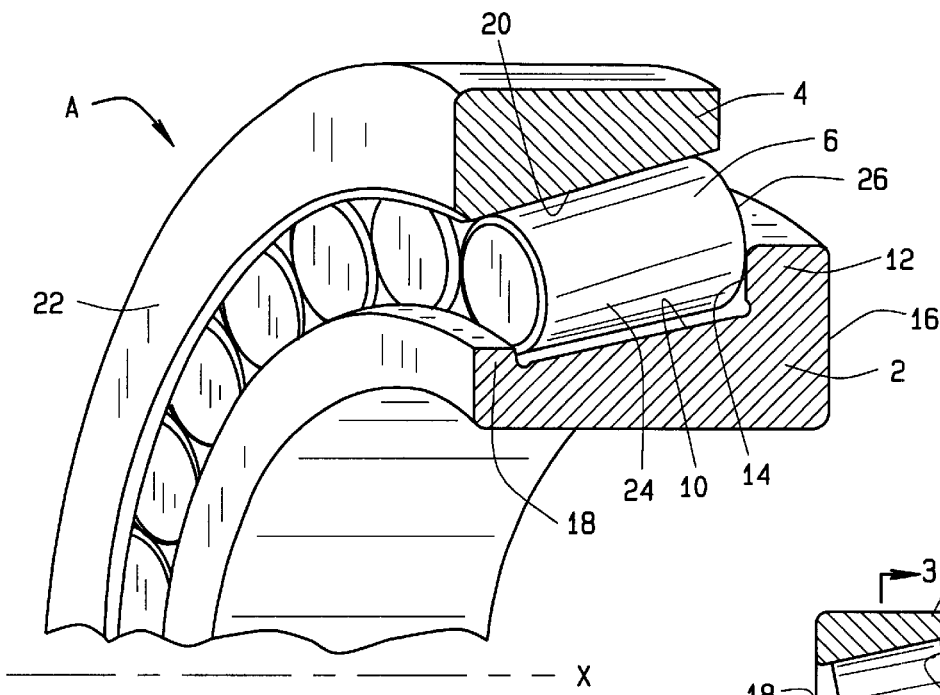
FIG. 1 is a fragmentary perspective view, broken away and in section, of a full complement antifriction bearing constructed in accordance with and embodying the present invention.
Figure 2:
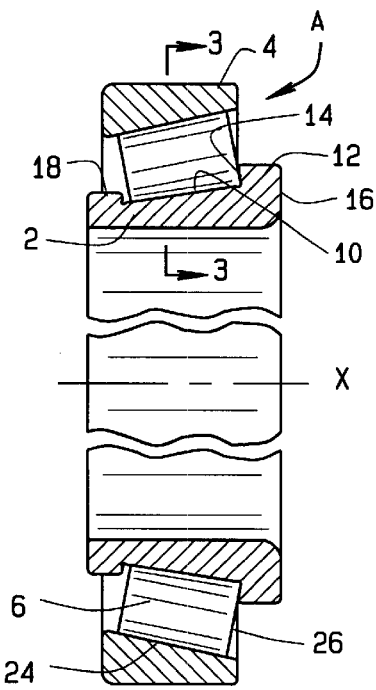
FIG. 2 is a sectional view of the bearing.
Figure 3:
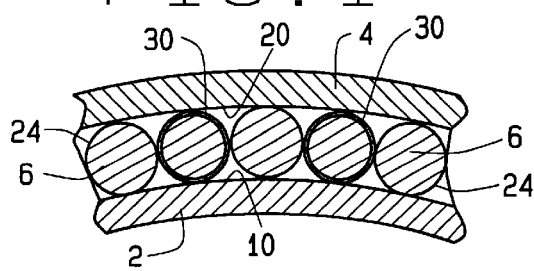
FIG. 3 is a fragmentary sectional view taken along line 3—3 of FIG. 2.
Figure 4:
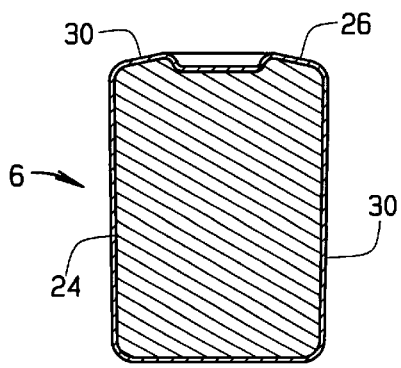
FIG. 4 is a sectional view of one of the rolling elements in the bearing showing the tribological coating.

Referring now to the drawings, a full complement antifriction bearing, in the form of a tapered roller bearing A, carries maximum load for a bearing of its size and is as durable as bearings of lesser capacity. It includes an inner race in the form of a cone 2, and an outer race in the form of a cup 4, and tapered rollers 6 organized in a circular row between the cone 2 and cup 4. The bearing A accommodates rotation about an axis X, and the cone 2 and cup 4 are concentric about the axis X.

The cone 2 has a tapered raceway 10 which is presented outwardly away from the axis X. At the large end of its raceway the cone 2 has a thrust rib 12 provided on one end with a rib face 14 that extends away from the raceway 10 and at its other end with a back face 16 that is squared off with respect to the axis X. At the small end of the raceway 10, the cone 2 has a retaining rib 18.

The cup 4 has a tapered raceway 20 which is presented inwardly toward the axis X and surrounds the raceway 10 on the cone 2. The raceway 20 at its small end leads out to a back face 22 which is squared off with respect to the axis X.

Each roller has a tapered side face 24 along which it contacts the raceways 10 and 20 and a large end face 26 along which it contacts the rib face 14 of the thrust rib 12. The rollers 6 are essentially frustoconical in configuration and are on apex, meaning that the conical envelopes in which the side faces 24 for all the rollers 6 have their apices at a common point along the axis X and the conical envelopes for the raceways 10 and 20 likewise have their apices at the same point. As a consequence, when the bearing A is in operation, the rollers 6 along their side faces 24 roll along the raceways 10 and 20 without any sliding or slipping. Pure rolling contact exists between the side faces 24 of the rollers 6 and the raceways 10 and 20.

However, owing to the absence of a cage to separate the rollers 6, adjacent rollers 6 may contact each other along the tapered side faces 24 of those rollers 6. Moreover, the rollers 6 seek to move up the raceway 10 and 20, but are restrained by the thrust rib 12 on the cone 2. Indeed, the large end faces 26 of the rollers 6 slide and spin along the rib face 14 of the thrust rib 12.

The bearing A has the capacity to transmit heavy radial loads and also axial or thrust loads in one axial direction, that is the direction in which the axial load is transferred through the back face 16 of the cone 2 and the back face 22 of the cup 4. The bearing A is mounted in opposition to another antifriction bearing that likewise has the capacity to transfer radial and axial loads, but being in opposition, its capacity to transfer axial loads is in the opposite direction. The bearing A and the bearing in opposition to it are adjusted against each other to a desired setting which may be end play or preload, but preferably is preload.

The cone 2 and cup 4 are formed from a bearing grade steel which is preferably case hardened, such as by case carburizing. The steel may be a low carbon steel typical of the steels from which bearing components are manufactured or a stainless steel. The rollers 6 in larger sizes may be formed from the same steels and likewise case hardened. In smaller sizes they are formed from a higher carbon steel that is through hardened. The steel of the cone 2 is exposed along the raceway 10 and rib face 14 of the cone 2. Likewise the steel of the cup 4 is exposed along the raceway 20 of the cup 4. Thus the rollers along their side faces 24 and end face 26 bear against the steel of the races 2 and 4.

Every roller 6, or in the alternative every other roller 6, is covered with a tribological coating 30, and for each such roller 6, the coating 30 extends over the entire tapered side face 24 and that much of the large end face 26 that contacts the rib face 14 on the thrust rib 12. The tribological coatings 30 on the rollers 6 control friction or wear, and more likely both, on the rollers 6 and along the raceways 10 and 20 and the rib face 14. To be sure, the substrate over which the coating 30 extends, that is the steel of the roller 6, plays a role in determining the frictional and wear performance of the roller 6, but the coating 30 reduces both friction and wear. In any event, the coating 30 on a roller 6 is not so thick as to behave as a bulk material. Practically speaking, a tribological coating is not thicker than about 1.0 mm. The thickness of the coating 30 is from a tribologically effective thickness to no more than about 1 mm.

Tribological coatings can be applied to the bearings using gaseous state processes, solution state processes, and molten or semi-molten state processes. Gaseous state processes are those in which the coating material passes through a gaseous or vapor phase prior to depositing onto or modifying the substrate surface. Examples of these kinds of processes are chemical vapor deposition (CVD), physical vapor deposition (PVD), ion beam implantation and ion beam assisted deposition. Examples of solution state processes are electroplating and electroless plating. Examples of molten and semi-molten state processes are laser surface treatments and hard facing techniques of thermal spraying and welding. These processes are well known in the art.

Tribological coatings can be used to eliminate the adhesive wear mechanism between rolling elements in these full complement rolling element bearings. They can do this in several ways. Firstly, a tribological coating can provide a chemically dissimilar surface that inhibits the formation of junctions from opposing asperities, if one surface is coated and the other is not. Secondly, some tribological coatings transfer some of their material to the opposing surface, and the interaction between the transferred material and the tribological coating can have very low shear strength. This not only inhibits adhesive wear, but can sometimes reduce the friction at the contact between the rolling elements. Thirdly, some tribological coatings have the ability to mechanically polish the uncoated counter-face, thereby removing asperities and decreasing the potential to form adhesive junctions. This ability is desirable if the bearing designer chooses to apply tribological coatings to every other rolling element, instead of every element.

Tribological coatings can be formed from many different material systems. Tribological coatings usable in this invention include materials selected from the class consisting of elemental metals, semimetals, and non-metals. Compounds such as carbides (e.g., TiC, WC, $B_4C$, etc.), nitrides (e.g., TiN, CrN, TiAlN, etc.), oxides (e.g., $Al_2O_3$, $TiO_2$, etc.), sulfides (e.g., $MoS_2$, $WS_2$, etc.), and borides (e.g., $TiB_2$, $WB_2$, etc.) are also used as tribological coating materials. Finally, nanocomposited material, such as those comprised of nanocrystalline metal carbides embedded in amorphous carbon or hydrocarbon matrices, are also desirable tribological coatings.

In practice, the selection of a suitable tribological coating for this invention depends upon many things, including the compatibility of the coating deposition process with the bearing material and geometry, the compatibility of the mechanical properties of the coating with the bearing material and the contact stresses, the abrasiveness of the coating to mating coated and uncoated surfaces, the wear resistance of the coating, and its fracture strength.

Some tribological coatings can increase the fatigue life and load rating of bearings when applied to rolling elements. Therefore, a judicious choice of a tribological coating can provide an increased fatigue life as well as provide a barrier to the adhesive wear in a full complement rolling element bearing.

Triboligical coatings have been described for rolling element bearings. However, these disclosures have not addressed the problem of wear in full complement rolling element bearings. Some of these disclosures also relate to the use of tribological coatings in poor lubrication conditions. However, poor lubrication is not a condition intended to be present in the present full complement rolling element bearing of this invention. Among these disclosures are Lemelson U.S. Pat. No. 5,067,826, Liston U.S. Pat. No. 5,593,234, Dam U.S. Pat. No. 5,700,094, Horton U.S. Pat. No. 6,340,245, and Linow *Surface and Coatings Technology*, 76–77 (1995) 579–582. All of these show methods of applying tribological coatings which are known in the art. None of these disclose the use of tribological coatings on full complement rolling element bearings.

The coatings 30 may be applied to rolling elements of other configurations. For example, the coating 30 may be on the cylindrical surface and the ends of cylindrical rollers in a cylindrical roller bearing, or on the barrel-shaped rollers of a spherical roller bearing, or on the needles of a needle bearing, or on the balls of ball bearings, all in a full complement organization. Moreover, irrespective of the type of bearing, the inner race may be integrated into a machine component such as a shaft or spindle, whereas the outer race may be integrated into another machine component such as a hub or housing.

Following are specific examples showing processes, including a preferred method, of applying tribological coatings to the rollers of a full complement tapered roller bearing.

Example. No. 1

Gaseous State Process

The most desirable coating for this invention is a nanocomposite WC/aC:H material. WC/aC:H coatings are comprised of nanocrystalline tungsten carbide embedded in an amorphous hydrocarbon matrix. The preferred method of applying this coating is through reactive magnetron sputtering, which is a gaseous state process. Prior to coating, the rollers need to be cleaned to ensure adequate adhesion of the coating to the rollers. Since the rollers are part of a tapered roller bearing, it is of benefit to apply the coating to the large roller ends as well as the roller bodies. This is an additional benefit since the application of a coating to the large roller ends reduces or eliminates the threat of rib face scuffing in tapered roller bearings. Therefore, it is desirable to mount the rollers within the vacuum deposition chamber in such a manner that the coating will be applied to the roller races as well as the large roller ends. After mounting the rollers in the chamber, the chamber is evacuated to a desirable vacuum level (typically less than $1 \times 10^{-5}$ Torr). The vacuum level is desirable since it reduces the amount of water vapor in the chamber to a level where it will not compromise the properties of the coating. The actual deposition process for WC/aC:H coatings has four steps.

The first step is to "plasma etch" the rollers. This is accomplished by flowing Argon, or another easily ionizable gas, into the chamber (with a chamber pressure less than $\sim 10^{-2}$ Torr), igniting an $Ar^+$ plasma, and applying a negative bias voltage to the rollers. The negative bias voltage on the rollers electrostatically accelerates the positively charged Ar ions causing them to impact the surface of the rollers. The impact of the Ar ions in turn sputters residual gas, metal, and contaminants from the surface of the rollers. The goal of this step is to achieve an atomically clean and mechanically suitable surface to provide the best possible bonding for the coating.

The second step is to deposit a suitable "adhesion layer". For WC/aC:H coatings, the adhesion layer preferably is elemental Chromium. The Cr metal is deposited by sputtering it from Cr targets residing on magnetrons with Ar ions to a thickness of about 0.1 micrometers. The Cr forms chemical and mechanical bonds with the steel surface of the rollers, providing a sound foundation for the coating.

To avoid an abrupt interface between the Cr and the coating, a "gradient layer" is applied in the next step. This "gradient layer" is desirable to transition from the Cr to the WC/aC:H coating without generating sharp interfaces or large crystalline carbides. This layer is achieved by sputtering W or WC from targets residing on the remaining magnetrons with Ar ions, while at the same time smoothly increasing the flow rate of acetylene or other suitable hydrocarbon gas to the rate that will be used in the coating layer. No Cr is sputtered in this step, and the total thickness of this layer is typically about 0.1 micrometers.

Finally, the "coating layer" is applied by sputtering W or WC targets using a mixture of Ar and $C_2H_2$ gases. Whereas the Ar ions are the primary agents for sputtering the targets, the $C_2H_2$ functions in two ways. The $C_2H_2$ reactively forms carbides on the surface of the W targets that are then sputtered off the targets and incorporated into the coating on the rollers. The $C_2H_2$ also dissociates, forms radicals in the plasma within the chamber, and becomes incorporated into the coating on the rollers. This second function of the $C_2H_2$ is typical of a chemical vapor deposition process. The thickness of the coating is typically between 1 and 3 micrometers.

Example. No. 2

Solution State Process

A full complement tapered roller bearing is constructed where the rollers have been coated with a nickel phosphorus composite coating. This coating consists of a Ni—P matrix containing finely dispersed particles of SiC, WC, CrC, $Al_2O_3$, diamond, graphite, or PTFE. The deposition of these types of coatings is accomplished by electroless deposition, an example of a solution state process.

Example No. 3

Semi-molten State Process

Coatings for bearings are hard and have high wear resistance. Hard bearing materials are used where the embedding of abrasive particles and self-alignment are not required and where lubrication may be marginal. The inherent nature of thermal spray coatings, (a semi-molten state process), provides benefits for a full complement tapered roller bearing due to the porosity of the coating acting as a lubricant reservoir and the composite nature of included oxides and amorphous phases increasing wear resistance. Some coatings show relatively low macro-hardness compared to their relative wrought or cast materials, but very often show improved wear resistance. Commonly used coatings include, cermet coatings like tungsten carbide/cobalt and chromium carbide/nickel chromium, oxide ceramics like chromium oxide and alumina, molybdenum, and various hard alloys of iron, nickel, chromium or cobalt.

Those skilled in the art can now appreciate from the foregoing description that the broad teachings of the present invention can be implemented in a variety of ways. Therefore, while this invention has been described in connection with specific examples thereof, the true scope of the invention is not so limited since other modifications will become apparent to the skilled practitioner upon a study of the drawings, specification and the following claims.

What is claimed is:

1. A full complement antifriction bearing for accommodating rotation about an axis, said bearing comprising:
   a first inner race having a steel raceway;
   a second race having a steel raceway presented toward the raceway on the inner race; and
   steel rolling elements located between the first and second races where they contact the raceways on the races, the rolling elements being arranged such that adjacent rolling elements contact each other, the surfaces of at least every other one of the rolling elements where the rolling elements contact each other and the steel raceways being covered with a tribological coating, the said steel raceways on the said first and second races having no tribological coatings.

2. A bearing according to claim 1 where every rolling element is covered with a tribological coating.

3. A bearing according to claim 1 where every other rolling element is covered with a tribological coating.

4. A bearing according to claim 1 wherein the first race lies within the second race, with the raceway on the first race being presented away from the axis and the raceway of the second race being presented toward the axis.

5. A bearing according to claim 4 wherein the raceways are tapered and one of the races has a steel rib provided with a steel rib face at the large end of its raceway; wherein each roller has a tapered side face and an end face at the large end of its side face, with the tapered side faces being against the tapered raceways and the large end faces being against the rib face; and wherein the coatings on those rollers that are covered with coatings extend over the tapered side face of the rollers.

6. A bearing according to claim 1 wherein the thickness of the tribological coating is less than about 1 millimeter.

7. A bearing according to claim 1 wherein the coating is deposited by a gaseous state process.

8. A bearing according to claim 7 wherein the coating material is selected from the group consisting of elemental metals, semimetals, and non-metals.

9. A bearing according to claim 8 wherein the coating material is a compound elected from the croup consisting of carbides, nitrides, oxides, sulfides, and borides.

10. A bearing according to claim 8 wherein the coating material is a nanocomposite material.

11. A bearing according to claim 7 wherein the coating is deposited by a solution state process.

12. A bearing according to claim 7 wherein the coating material is selected from the group consisting of elemental metals, semimetals, and non-metals.

13. A bearing according to claim 12 wherein the coating material is a compound selected from the group consisting of carbides, nitrides, oxides, sulfides and borides.

14. A bearing according to claim 12 wherein the coating material is a nanocomposite material.

15. A bearing according to claim 7 wherein the coating deposited by a semi-molten state process.

16. A bearing according to claim 7 wherein the coating material is selected from the group consisting of elemental metals, semimetals, and non-metals.

17. A bearing according to claim 16 wherein the coating material is selected from the group consisting of carbides, nitrides, oxides, sulfides, and borides.

18. A bearing according to claim 16 wherein the coating material is selected from the group consisting of carbides, nitrides, oxides, sulfides, and borides.

19. A bearing according to claim 16 wherein the coating material is a nanocomposite material.

20. The bearing according to claim 1 wherein the races are formed from a bearing grade steel.

21. The bearing according to claim 20 wherein the steel is case hardened.

22. The bearing according to claim 20 wherein the steel is a stainless steel.

23. The bearing according to claim 20 wherein the rolling elements are bearing grade steel and case hardened.

24. The bearing according to claim 20 wherein the rolling elements are high carbon steel and through hardened.

* * * * *